(12) United States Patent
Shimizu

(10) Patent No.: US 6,759,709 B1
(45) Date of Patent: Jul. 6, 2004

(54) NONVOLATILE SEMICONDUCTOR MEMORY DEVICE

(75) Inventor: Shu Shimizu, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/620,431

(22) Filed: Jul. 17, 2003

(30) Foreign Application Priority Data

Jan. 30, 2003 (JP) .................................... P 2003-021755

(51) Int. Cl.$^7$ .......................................... H01L 29/788
(52) U.S. Cl. ...................... 257/315; 257/239; 257/261; 257/316; 257/298; 438/201; 438/211; 438/216; 438/257; 438/593
(58) Field of Search .................................. 257/239, 261, 257/298, 315–326; 438/201, 211, 216, 241, 257, 258, 260–266, 591, 593

(56) References Cited

U.S. PATENT DOCUMENTS 5,817,556 A 10/1998 Sasaki
6,306,737 B1 * 10/2001 Mehrad et al. ............. 438/624
6,337,244 B1 * 1/2002 Prall et al. .................. 438/257

FOREIGN PATENT DOCUMENTS

JP          8-102531          4/1996

* cited by examiner

Primary Examiner—David Nelms
Assistant Examiner—Andy Huynh
(74) Attorney, Agent, or Firm—McDermott, Will & Emery

(57) ABSTRACT

A nonvolatile semiconductor memory device including a semiconductor substrate 1, a plurality of memory cells 1a on the semiconductor substrate including transistors having floating gate electrodes and control gate electrodes. Source lines 30 are formed in a self-alignment manner with respect to a control gate electrodes. The surface of the semiconductor substrate 1 has such a periodical unevenness along the source lines 30 which has a diffusion layer 30a that an impurity is distributed along the surface of the semiconductor substrate 1 and a buried diffusion layer 30b that an impurity is distributed at a position deeper than said diffusion layer 30a. The buried diffusion layer 30b connects a plurality of portions of the diffusion layers 30a under the bottom surface 5b of the recess portion 5 to each other.

4 Claims, 13 Drawing Sheets

NONVOLATILE SEMICONDUCTOR MEMORY DEVICE

BACKGROUND OF THE INVENTION

1. Field of the Invention

The present invention relates to a semiconductor memory device and, more particularly, to a nonvolatile semiconductor memory device.

2. Description of the Background Art

In a nonvolatile semiconductor memory device having a two-layer-gate structure, a source line is frequently formed in a self-alignment manner (SAS: Self Aligned Source) to reduce a pattern size of elements (for example, Japanese Laid-open Patent No. HB-102531) In such a nonvolatile semiconductor memory device, an element isolation insulating film is formed on a semiconductor substrate in a certain direction in the shape of a stripe, and a control gate electrode is formed in the shape of a stripe in a direction perpendicular to the element isolation insulating film. After the element isolation insulating film is removed by etching, a source line is formed in a self-alignment manner, i.e. by injecting an impurity ion using the control gate electrode as a mask. When the source line is formed by such a method, a memory cell can reduce its pattern size without an alignment error between the source line and the control gate electrode.

SUMMARY OF THE INVENTION

In the conventional nonvolatile semiconductor memory device, an impurity is diffused to a silicon substrate to form a source line after an element isolator film is removed. Since recesses are formed on the surface of the silicon substrate by removing the element isolation insulating film, a source line resistance is increased for the following reasons: A current in the source line started from the source region flows toward the source region of adjacent cells through the side surface, the bottom surface, and the side surface of the recessed portion. Therefore an effective source line length is larger than an apparent source line length by the length of the side surface of the recessed portion. In addition, since an impurity injection in the side surface of the recessed portion is more difficult than the bottom surface of the recessed portion, the side surface of the recession tends to have a high resistance. Thus, the resistance of the source line is increased.

This problem becomes serious when a memory cell is reduced in size for a high degree of integration. In particular, when trench element isolation is performed, in which an element isolation film is buried in a trench (=groove) formed in a semiconductor substrate, the problem becomes more serious. In the trench element isolation, a recessed portion is formed in the surface of the silicon substrate corresponding to the depth of the trench. The depth of the trench hardly changes, even when a gate width (W) of the memory cell is reduced. For this reason, as the memory cell reduces in size, a ratio of the source line length between adjacent memory cells to the size of the memory cell in the direction of the gate width (W) increases. This increases a source line resistance per unit bit.

Accordingly, an object of the present invention is to provide a nonvolatile semiconductor memory device that has a low source line resistance and good scalability.

According to the present invention, there is provided a nonvolatile semiconductor memory device comprising:

a semiconductor substrate, a plurality of memory cells arranged in the form of a matrix on said semiconductor substrate, each of said memory cells including transistors having floating gate electrodes and control gate electrodes;

element isolation insulating films for isolating said memory cells; and source lines formed in a self-alignment manner with respect to said control gate electrodes;

wherein the surface of said semiconductor substrate has such a periodical unevenness along said source lines that the portions of said memory cells form projection portions and the portions where said element isolation insulating films have removed form recess portions;

each of said source lines has a diffusion layer that an impurity is distributed along the surface of said semiconductor substrate and a buried diffusion layer that an impurity is distributed at a position deeper than said diffusion layer;

and said buried diffusion layer connects a plurality of portions of said diffusion layers under the bottom surface of said recess portion to each other.

BRIEF DESCRIPTION OF THE DRAWINGS

The above and other objectives and features of the present invention will become more apparent from description of a preferred embodiment thereof with reference to the accompanying drawings, throughout which like parts are designated by like reference numerals, and wherein.

DETAILED DESCRIPTION OF PREFERRED EMBODIMENTS

The application is based on applications No. JP2003-021755 filed in Japan, the content of which is incorporated herein by reference.

Embodiment 1

Figure 1:
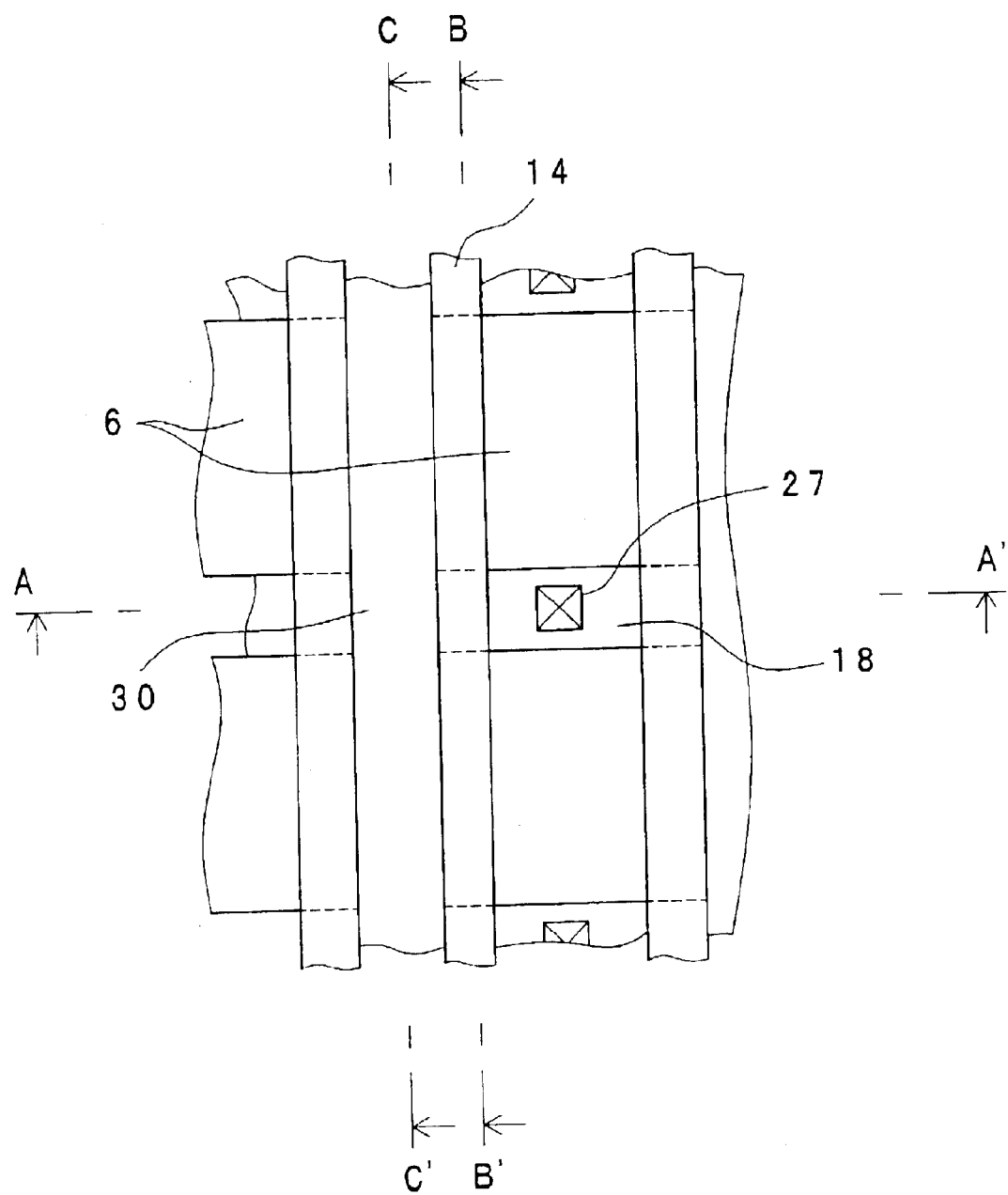
FIG. 1 is a plan view showing a nonvolatile semiconductor memory device according to the first embodiment of the present invention.

FIG. 1 is a partially enlarged plan view showing a nonvolatile semiconductor memory device according to the first embodiment of the present invention. In this embodiment, a nonvolatile semiconductor memory device using, as a memory cell, a transistor having a two-layer gate structure will be exemplified. In the nonvolatile semiconductor memory device according to this embodiment, control gate electrodes 14 are formed on a semiconductor substrate in the form of stripes, and element isolation insulating films 6 are formed in the direction perpendicular to the direction of the control gate electrode 14 in the form of stripes. Source lines 30 are formed on one side of the control gate electrode 14, and drains 18 are formed on the other side of the control gate electrode 14, so that a transistor serving as a memory cell is constituted. The drain 18 is isolated to form a unit memory cell by the element isolation insulating film 6 and connected to a bit line (not shown) through contact holes 27. The source line 30 is formed in a self-alignment manner by removing the element isolation insulating film 6 and injecting impurity ions by using the control gate electrode 14 as a mask.

Figure 2:
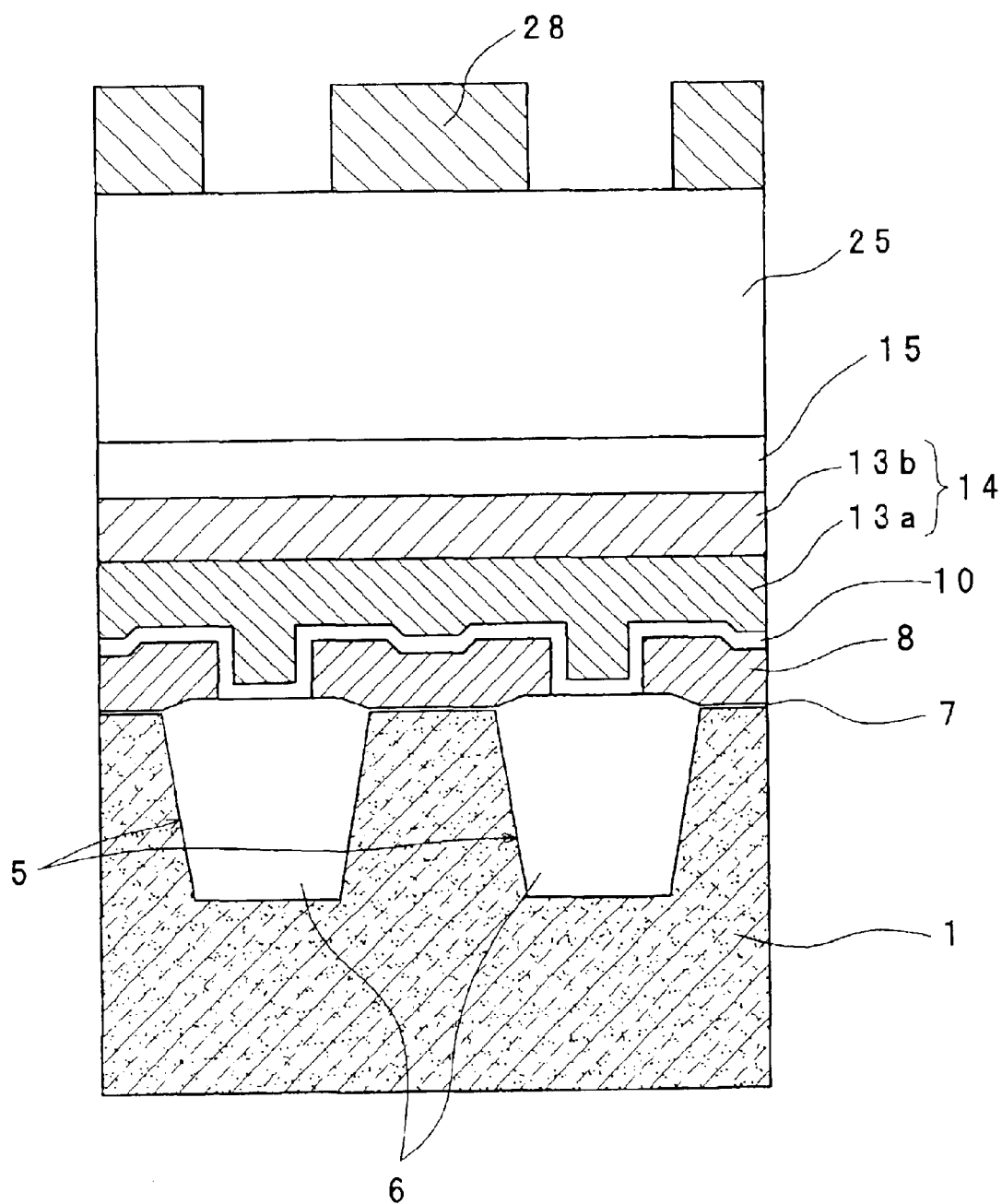
FIG. 2 is a sectional view showing the B–B' section in FIG. 1.

FIG. 2 is a sectional view of a B–B' section in FIG. 1. As shown in FIG. 2, the element isolation insulating film 6 is buried in a trench 5 formed in a silicon substrate 1 to establish so-called trench element isolation (STI). A transistor having a two-layer gate structure is formed on the projection portion of the silicon substrate 1 sandwiched by the element isolation insulating films 6. More specifically, on the projection portion of the silicon substrate 1, a tunnel oxide film 7 constituted by a thermal oxide film, a floating gate electrode 8 consisting of polysilicon, a three-layer film (=ONO film) 10 constituted by oxide/nitride/oxide films. a control gate electrode 14 constituted by a polysilicon layer 13a and a silicide layer 13b, and an oxide film 15 are formed. A bit line 28 is formed in a direction perpendicular to the control gate electrode 14 through an insulating interlayer 25 consisting of BPSG.

Figure 3:
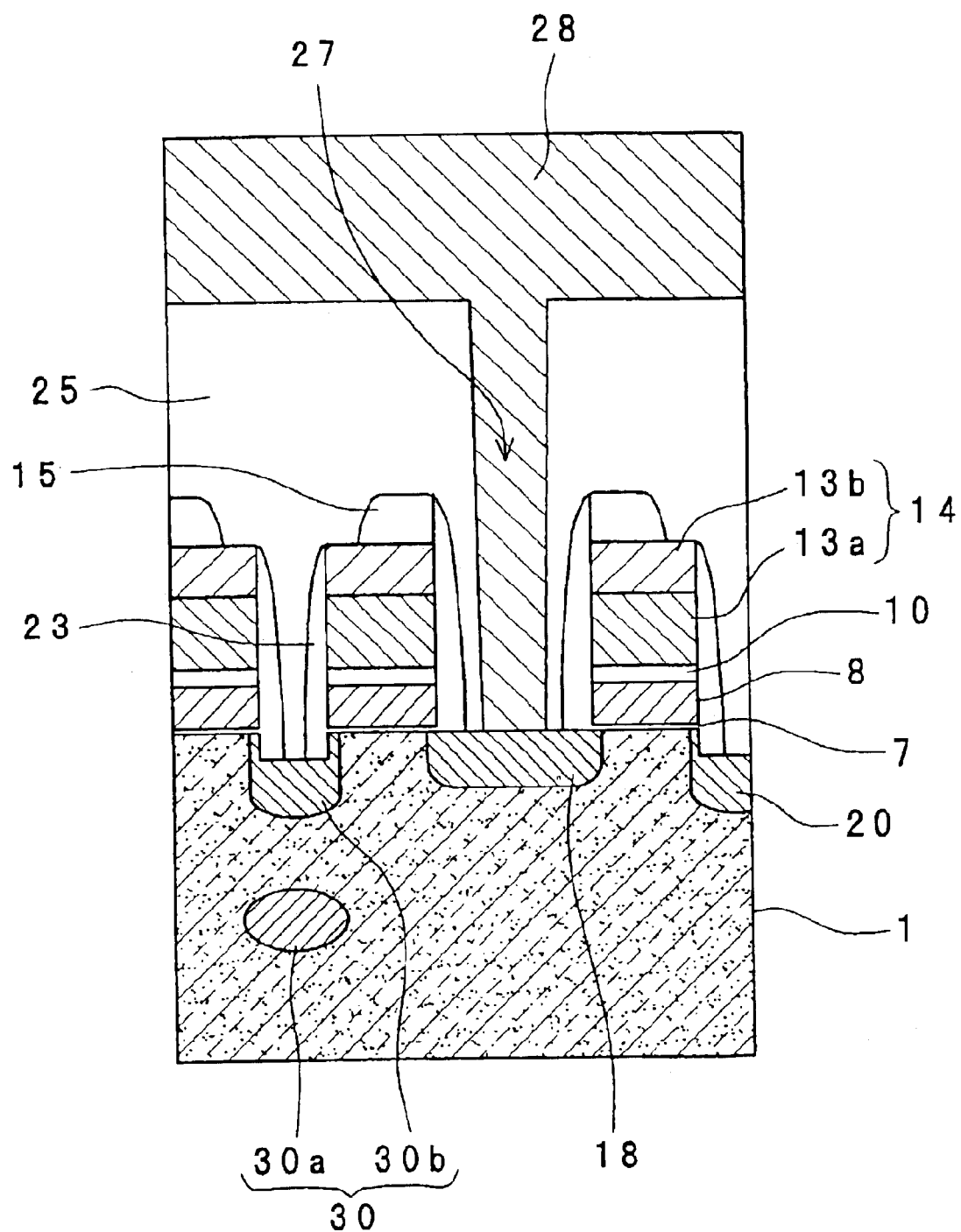
FIG. 3 is a sectional view showing the A–A' section in FIG. 1.

The section of a transistor constituting each memory cell is shown in FIG. 3. FIG. 3 is a sectional view of an section A–A' in FIG. 1. As shown in FIG. 3, the side surface of the two-layer gate are covered with side walls 23 and are further covered with the insulating interlayer 25. The drain 18 and the source line 30 are formed on the sides of the two-layer gate. The drain 18 is connected to the bit line 28 through the contact hole 27. The source line 30, which is the feature of the present invention, is constituted by a diffusion layer 30b also serving as a source region of the transistor and a buried diffusion layer 30a formed at a position deeper than the diffusion layer 30b.

Figure 4:
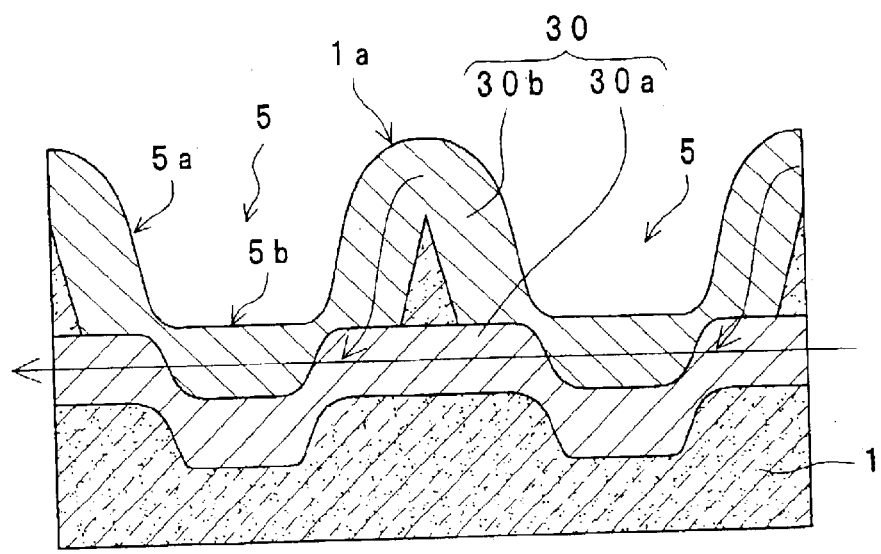
FIG. 4 is a sectional view showing the C–C' section in FIG. 1.

The sectional view of the source line 30 in the longitudinal direction is shown in FIG. 4. FIG. 4 is a sectional view showing a C–C' section in FIG. 1. As shown in FIG. 4, in regions for forming the source lines 30, the surface of the silicon substrate 1 has a periodical uneven shape such that portions corresponding to the memory cells forms projection portions 1a and portions where the element isolation insulating films are removed forms recessed portions 5. On the sectional view shown in FIG. 4, a projection portion 1a of the silicon substrate corresponds to a source region of the memory cell. The source line 30 is constituted by two layers, i.e., a diffusion layer 30b formed by injecting an impurity at a depth equal to that of a conventional technique and a buried diffusion layer 30a obtained by injecting an impurity at a position deeper than the diffusion layer 30b. The diffusion layer 30b and the buried diffusion layer 30a are connected to each other and integrated with each other to constitute the source line 30. At least the lower end of the impurity distribution of the buried diffusion layer 30a under the projection portion 1a is set deeper than a bottom surface 5b of the recessed portion of the silicon substrate 1. The buried diffusion layers 30a connects two portions of the diffusion layer 30b under the bottom surfaces 5b to make an almost linear current path. Preferably, the impurity concentration peak of the buried diffusion layer 30a under the projection portion 1a of the silicon substrate 1 is set at a position deeper than the bottom surface 5b of the recessed portion. In the present invention, a boundary of the diffusion layer or the buried diffusion layer is determined by checking whether the impurity concentrations are equal to or larger than $10^{13}$ cm$^{-2}$ or more. In other words, the diffusion layer 30b and the buried diffusion layer 30a are portions having impurity concentrations of $10^{13}$ cm$^{-2}$ or more.

In such source lines 30, after the current is read out from the source region (=projection portion 1a) and through the diffusion layer 30b at the side surface 5a of the recessed portion, the current flows in an almost linear path while alternately passing through the diffusion layer 30b under the bottom surface 5b of the recessed portion and the buried diffusion layer 30a under the projection portion 1a. More specifically, the source line 30 has a current path which almost linearly connects portions under the bottom surfaces of the recessed portions 5. This current path is made by the impurity distributed under the projection portion 1a of the semiconductor substrate to a position deeper than the bottom surfaces of the recessed portions 5. This reduces the substantial line length. and resistance of the source line 30. In addition, the number of times of passing through the side surface 5a of the recessed portion where the impurity injection into the diffusion layer 30b tends to be insufficient may be only one per unit bit. This also reduces resistance of the source line 30.

Figure 5:
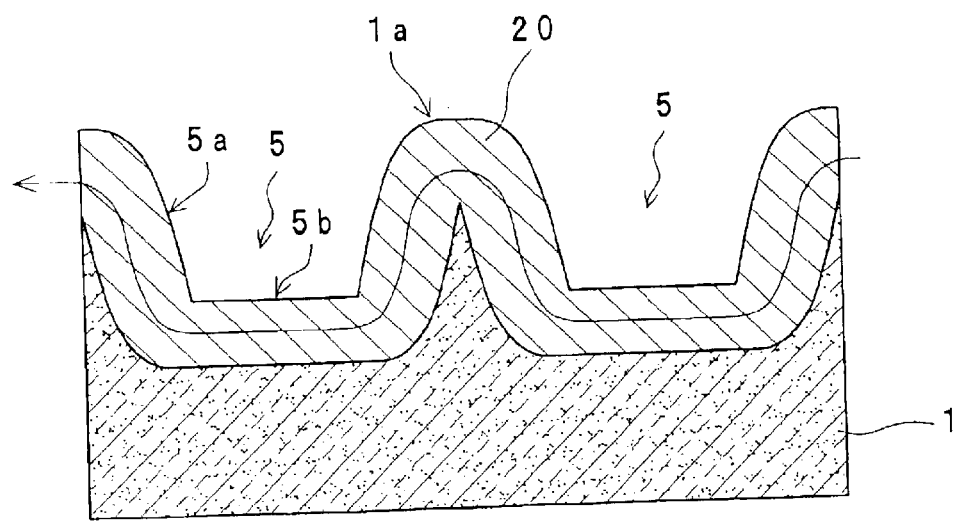
FIG. 5 is a sectional view showing the shape of a source line when a buried diffusion layer is not formed.

In contrast, a conventional source line, as shown in FIG. 5, is constituted by only a diffusion layer 20 in which an impurity is distributed along the surface of the silicon substrate 1. A current, which was read out from the source region (=projection portion 1a) of a certain memory cell through the diffusion layer 20 of the side surface 5a of the recessed portion, flows a winding current path while repeatedly passing through the bottom surface 5b of the recessed portion, the side surface 5a of the recessed portion, and the source region 1a of adjacent cells. For this reason, an effective source line length is longer than an apparent source line length by the length of the side surface 5a of the recessed portion. In addition, since the impurity injection into the side surface 5a of the recessed portion is more difficult than into the bottom surface 5b of the recessed portion, the side surface 5a of the recessed portion tends to have a high resistance. This further increases the resistance of the source line 20.

The effect of the present invention becomes remarkable when a memory cell is reduced in size for a high degree of integration. In particular, when trench element isolation is performed, in which an element isolation insulating film is buried in a trench (=groove) formed in a semiconductor substrate, the effect is more remarkable. Because, in the trench element isolation, the depth of the trench hardly changes even when the gate width (W) of the memory cell is reduced. In a conventional source line, a ratio of the length of the side surface of the recessed portion to the total source line length increases when the memory cell reduces in size. Accordingly, a ratio of the effective source line length between adjacent memory cells to the size of the memory cell in the direction of the gate width (W) increases. In the present invention, even when the memory cell is reduced in size, a ratio of the effective source line length between adjacent memory cells to the size of the memory cell in the direction of the gate width (W) rarely increases. Therefore, an increase in source line resistance per unit is considerably suppressed.

Meanwhile, since a buried diffusion layer is formed to obtain a source line in the present invention, the source line is distributed in a deeper region. This may lower a source-drain withstand voltage than that of a conventional technique. However, a decrease in withstand voltage need not be considered in a flash memory in which a source is at a ground level or in an open (floating) state in any of write, erase, and read operations. Therefore, the present invention, in which not a drain but source region is formed deeper, is suitable for a flash memory.

In this embodiment, since the buried diffusion layer 30a and the diffusion layer 30b are vertically connected to each other under the bottom surface 5b of the recessed portion, the sectional area of the source line under the bottom surface 5b of the recessed portion increases. This further reduces the source line resistance. In particular, in this embodiment, the depth of the buried diffusion layer 30a is greater under the recessed portion 5 than under the projection portion 1a. Accordingly, the effect of the increase in sectional area of the source line under the bottom surface 5b of the recessed portion is more remarkable. However, the shape of the buried diffusion layer 30a is not limited to a specific shape, and may be any shape which can almost linearly connect the portions of diffusion layers 30b under the bottom surface 5b of the recessed portion to each other.

For forming the buried diffusion layer 30a and the diffusion layer 30b, any n- or p-type impurity may be used. For example, As, P, and Sb, or the like may be used as a n-type impurity and B, BF2, or the like may be used as a p-type impurity. However, in order to prevent an impurity from being diffused in a portion under the control gate electrode 14, an impurity having a large atomic mass or a molecular mass is advantageously used. For example, As, BF2, or the like is preferably used. Doses of impurity in the buried diffusion layer 30a and the diffusion layer 30b can be like a conventional source line. For example, the does may be $10^{14}$ to $10^{15}$ cm$^{-2}$. The impurity concentrations of the buried diffusion layer 30a and the diffusion layer 30b may be equal to each other or may be different from each other. When the impurity concentration of the buried diffusion layer 30a is higher than the impurity concentration of the diffusion layer 30b, an amount of current flowing in the buried diffusion layer 30a increases. Thus, the negative influence of the steps in the source region can be reduced. On the other hand, when the impurity concentration of the diffusion layer 30b is higher than the impurity concentration of the buried diffusion layer 30a, the source resistance can be reduced while keeping the source-drain withstand voltage high.

A method of manufacturing a nonvolatile semiconductor memory device according to the embodiment will be described below. The method of manufacturing a nonvolatile semiconductor memory device according to the embodiment roughly comprises the step of:

forming an element isolation insulating film on a semiconductor substrate;

forming a plurality of transistors in the form of a matrix, each of which have control gate electrodes, source regions, and drain regions and are isolated from each other by the element isolation insulating film;

injecting an impurity into a source line forming region, which includes the source region and is parallel to the control gate electrode, in a self-alignment manner using the control gate electrode as a mask to form a buried diffusion layer in which an impurity is distributed to a position deeper than a bottom surface of the element isolation insulating film; and injecting an impurity into the source forming region in a self-alignment manner using the control gate electrode as a mask to form a diffusion layer in which an impurity is distributed along a surface of the semiconductor substrate.

After the buried diffusion layer is formed, the element isolation insulating film is preferably removed before the diffusion layer is formed. In the step of forming the diffusion layer, the impurity is preferably injected in the semiconductor substrate in both vertical and diagonal directions with respect to the semiconductor substrate.

The method will be described below in details.

(1) Formation of Trench Element Isolation

Figure 6A:
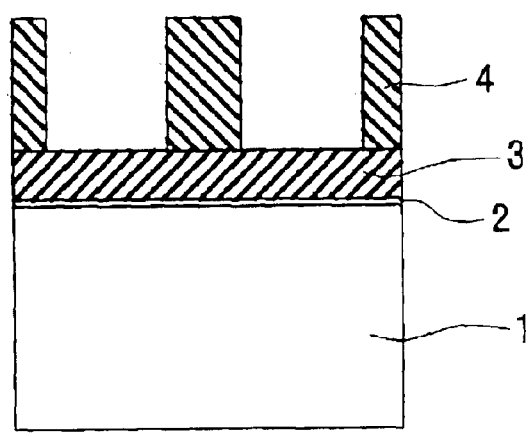
FIGS. 6A to 6S are step charts showing a method of manufacturing a semiconductor memory device according to the first embodiment of the present invention.

As shown in FIGS. 6A to 6G, a trench element isolation is formed on the silicon substrate. FIGS. 6A to 6G are step charts showing sectional views of the B–B' section in FIG. 1. First, as shown in FIG. 6A, a thermal oxide film 2 having a thickness of about 200 Å is formed on the surface of the silicon substrate 1, and a nitride film 3 having a thickness of about 2000 Å is formed on the thermal oxide film 2. A photoresist 4 is formed and partly removed by photolithography in a region where a trench is formed.

Figure 6B:
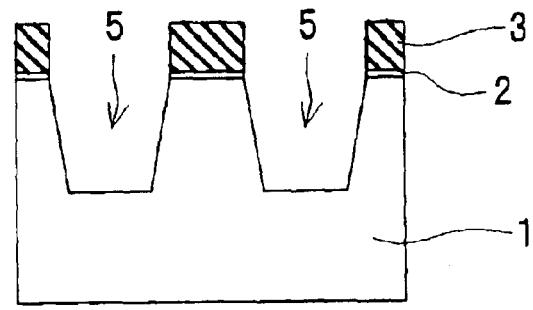

As shown in FIG. 6B, the nitride film 3 and the thermal oxide film 2 are dry-etched by using the photoresist 4 as a mask. After the photoresist 4 is removed, the silicon substrate 1 is dry-etched by using the patterned nitride film 3 and the patterned thermal oxide film 2 as masks to form a trench 5 having a depth of about 3000 Å. The depth of the trench 5 is preferably not less than 1000 Å, more preferably, not less than 2000 Å and is preferably not more than 3000 Å, more preferably not more than 5000 Å.

Figure 6C:
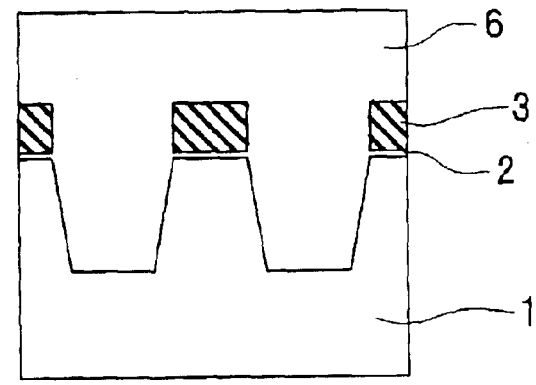

As shown in FIG. 6C, the inner wall of the trench is thermally oxidized in a thickness of about 300 Å. This oxidation is to remove a plasma damage layer by etching for forming the trench 5 and to round the corner of the trench 5 for suppressing electric field concentration at the corner of the trench 5. Thereafter, a buried oxide film having a thickness of about 5000 Å is deposited as an element isolation insulating film to bury the trench 5.

Figure 6D:
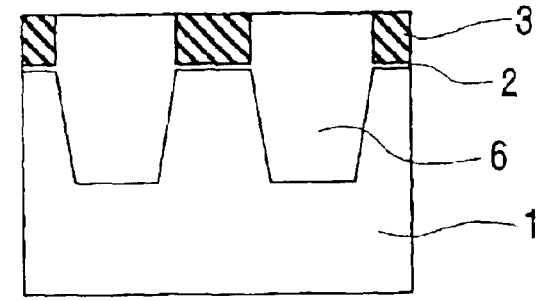
Figure 6E:
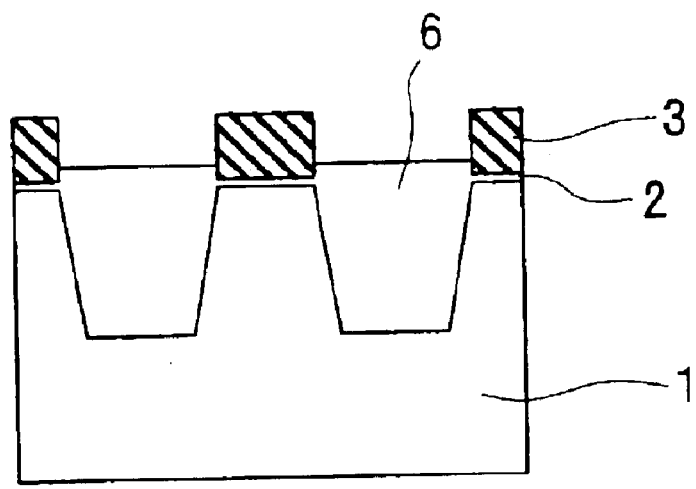
Figure 6F:
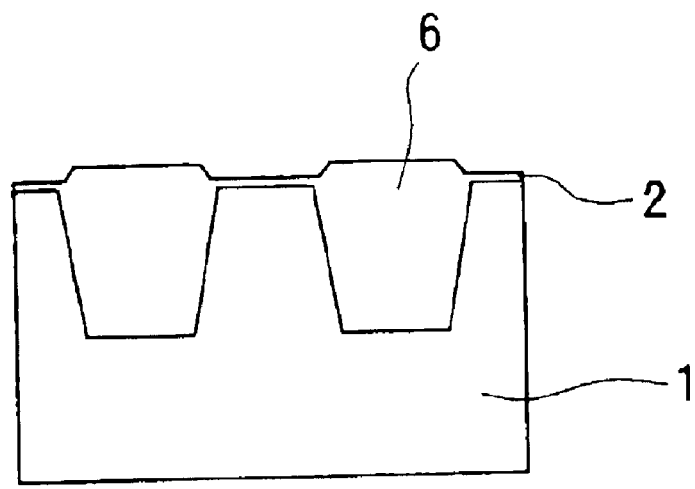
Figure 6G:
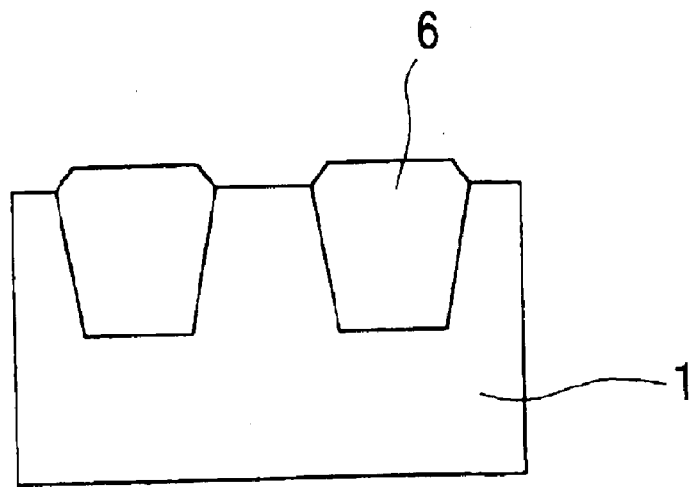

As shown in FIG. 6D, the buried oxide film 6 is flattened by chemical mechanical polishing (CMP). Thereafter, as shown in FIG. 6E, the buried oxide film 6 is wet-etched at a predetermined thickness by a diluted hydrofluoric acid. As shown in FIG. 6F, the nitride film 3 is removed by heated phosphor to form a trench element isolation (STI). As shown in FIG. 6G, ion injection for forming an n-type well and a p-type well is performed, and the thermal oxide film 2 is removed by a diluted hydrofluoric acid.

(2) Formation of Two-layer Gate Structure

Figure 6H:
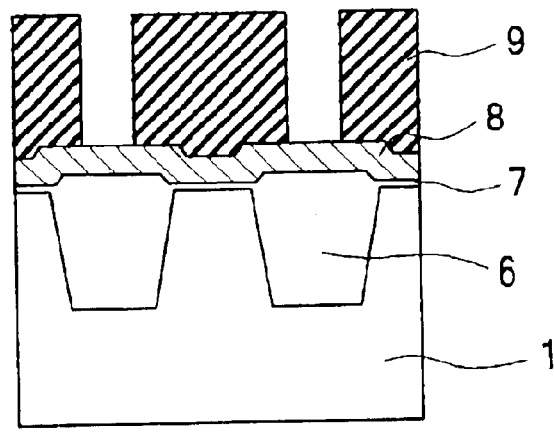
Figure 6I:
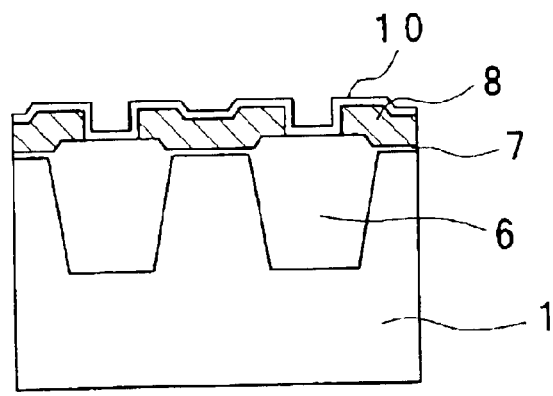
Figure 6J:
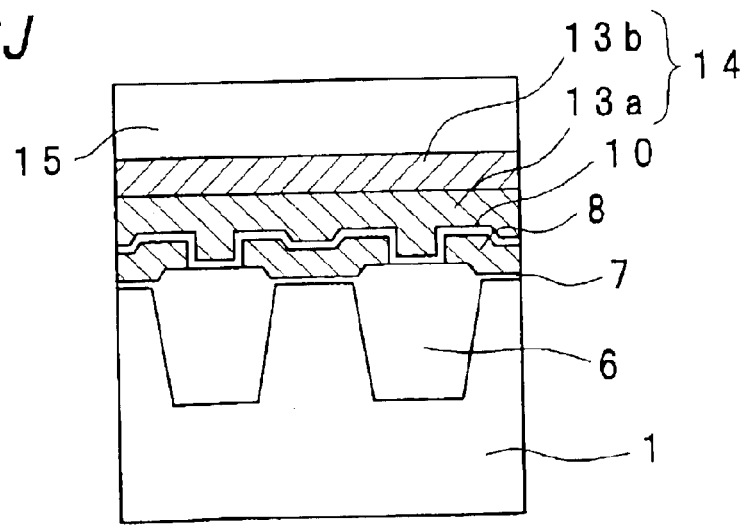

As shown in FIGS. 6H to 6J, a two-layer gate structure is formed. FIGS. 6H to 6J are step charts showing sectional views of the B–B' section in FIG. 1. As shown in FIG. 6H, a thermal oxide film 7 having a thickness of about 100 Å and serving as a tunnel oxide film of a memory cell, and a phosphorous-added polysilicon film 8 having a thickness of about 1000 Å and serving as a floating gate electrode of a memory cell is deposited. A photoresist 9 is formed and partly removed by photolithography to form stripes on the buried oxide film 6.

As shown in FIG. 6I, the phosphorous-added polysilicon film 8 is dry-etched by using the photoresist 9 as a mask to pattern the floating gate electrode in the direction of the gate width (W). After the photoresist 9 is removed, a thermal oxide film having a thickness of about 50 Å, a nitride film, and an oxide film are sequentially deposited on the surface of the phosphorous-added polysilicon film 8 to form an ONO film 10 constituted by three layers, i.e., oxide/nitrideloxide films.

After this step, a process required for forming a gate structure in a peripheral circuit region (not shown) is performed. More specifically, after the memory cell region is covered with a photoresist, the ONO film 10, the phosphorous-added polysilicon film 8, and the tunnel oxide film 7 in the peripheral circuit region are removed. After the photoresist which covers the memory region is removed, as shown in FIG. 6J, a thermal oxide film having a thickness of about 150 Å and serving as a gate oxide film in the peripheral circuit region is formed. Subsequently, the polysilicon layer 13a having a thickness of about 1000 Å and serving as the gate electrode of the peripheral circuit and the memory cell is formed. Further, a tungsten silicide (WSi) layer 13b and an oxide film 15 having a thickness of about 2000 Å are deposited.

The oxide film 15 is dry-etched in the form of a gate electrode by using a resist (not shown) as a mask. After the photoresist is removed, the tungsten suicide layer (WSi) 13b and the polysilicon layer 13a are dry-etched by using the patterned oxide film 15 as a mask to form a control gate electrode of a memory cell and a gate electrode of a peripheral circuit. The control gate electrode is formed in the form of stripes.

After the peripheral circuit region is covered with a resist, the ONO film 10 in the memory cell region and the phosphorous-added polysilicon film 8 are dry-etched by using the stripe patterned oxide film 15, the tungsten silicide layer 13b, and the polysilicon layer 13a as masks. Thus, a patterning in the direction of the gate length (L) of the floating gate is performed to form a floating gate electrode.

(3) Formation of Source-drain Region and Source Line

As shown in FIGS. 6K to 6N and FIGS. 7K to 7N, the source-drain region of a memory cell and a source line are formed. FIGS. 6k to 6N are step charts showing sectional views of the A–A' section in FIG. 1, and FIGS. 7K to 7N are step charts showing sectional views of the C–C' section in FIG. 1. FIGS. 6K to 6N and FIGS. 7K to 7N are sectional views showing the same step when viewed from different sections.

Figure 6K:
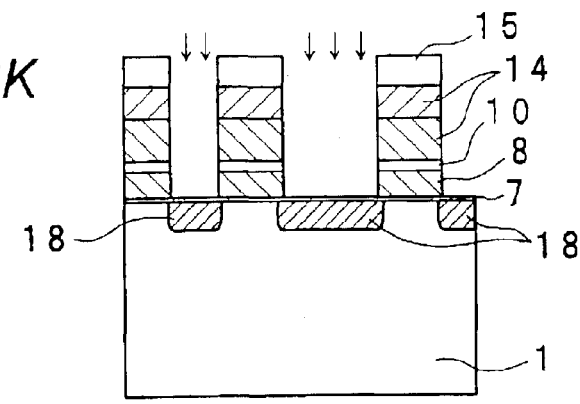
Figure 7K:
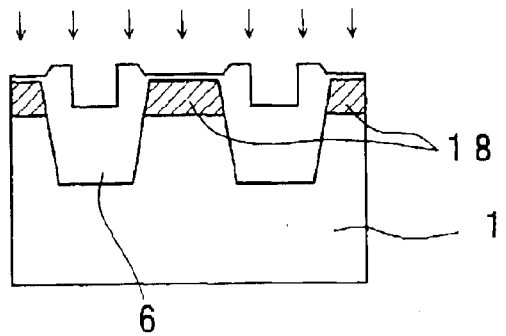
FIGS. 7K to 7N are step charts showing the steps corresponding to FIGS. 6K to 6N with respect to other sections.

As shown in FIG. 6K and FIG. 7K, ion injection of an impurity is performed by using a resist covering the peripheral circuit, the oxide film 15, the control gate electrode 14, the ONO film 10, and the floating gate electrode 8 as masks to form a source-drain region 18 of the memory cell in a self-alignment manner. At this time, the source-drain region 18 is formed on the projection portion of the silicon substrate 1 as shown in FIG. 7K.

Figure 6L:
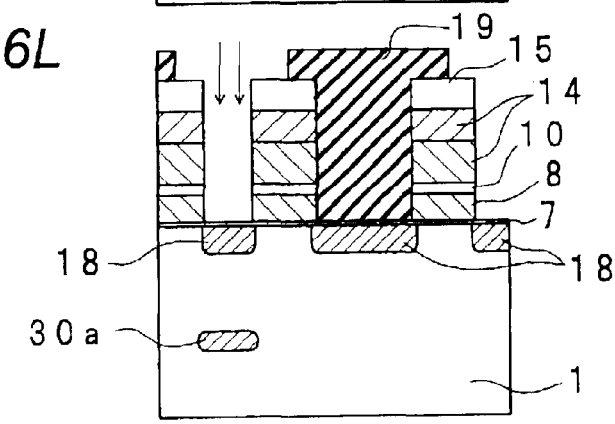
Figure 7L:
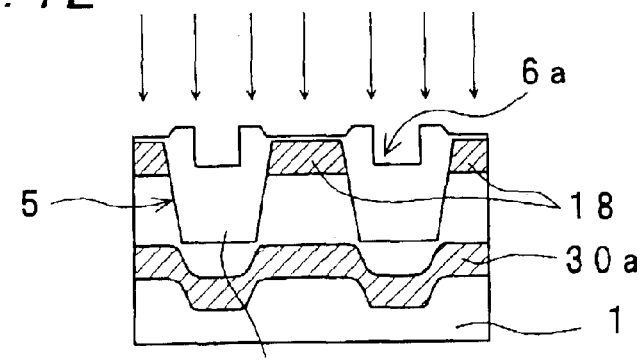

As shown in FIG. 6L and FIG. 7L, after the resist covering a peripheral circuit region is removed, a resist 19 covering the peripheral circuit region and the drain-side half of the memory cell is formed. Ion injection of an impurity is performed by using the resist 19, the patterned oxide film 15, the control gate electrode 14, the ONO film 10, and the phosphorous-added polysilicon film 8 as masks to form a buried diffusion layer 30a in a self-alignment manner. In this case, injection of impurity for forming the buried diffusion layer 30a is performed at a voltage higher than that of the injection of impurity into the source-drain region 18, so that the buried diffusion layer 30a is formed at a position deeper than the source-drain region 18. The depth of the buried diffusion layer 30a is at least set such that the lower end of the impurity distribution of the source line 30 under the source-drain region 18 is located at a position deeper than the bottom surface of the trench 5. More preferably, under the source-drain region 18, the peak of the impurity distribution of the buried diffusion layer 30a is located at a position deeper than the bottom surface of the trench 5. In order to form the buried diffusion layer 30a, for example, As (arsenic) may be injected in the order of $10^{15}$ cm$^{-2}$ by an energy of about 500 to 600 keV.

In this embodiment, as shown in FIG. 7L, the depth of the buried diffusion layer 30a is deeper under the trench 5 than under the source-drain region 18. This is because a stripe-like groove 6a is formed in opposite to the bottom surface of the trench 5 on the upper surface of the buried oxide film 6. When an impurity is injected in the structure under the same condition, the impurity can be more deeply injected into a portion of the stripe groove 6a recessed from the surface of the silicon substrate 1. For this reason, the depth of the buried diffusion layer 30a under the trench 5 is larger than that in another region. In this manner, by etching the upper surface of the buried oxide film 6 to a predetermined depth, the shape of the. buried diffusion layer 30a can be controlled.

Figure 6M:
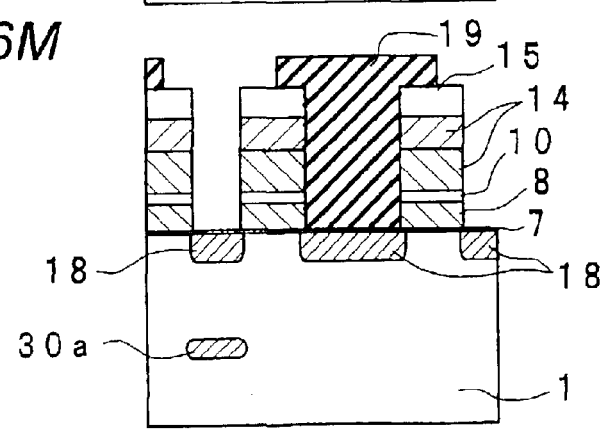
Figure 7M:
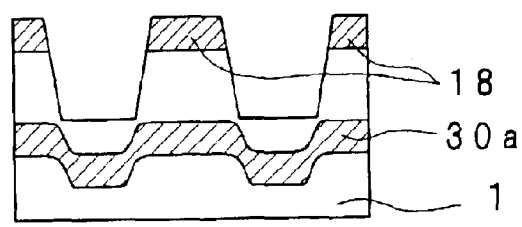

As shown in FIG. 6M and FIG. 7M, a buried oxide film is removed in a self-alignment manner by dry-etching by using the resist 19, the patterned oxide film 15, the control gate electrode 14, the ONO film 10, and the phosphorous-added polysilicon film 8 as masks.

Figure 6N:
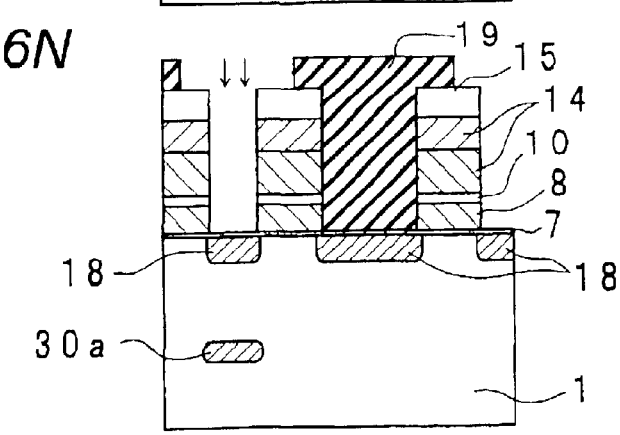
Figure 7N:
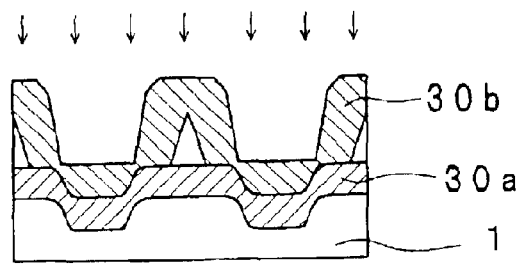

As shown in FIG. 6N and FIG. 7N, ion injection of impurity is performed by using the resist 19, the patterned oxide film 15, the control gate electrode 14, the ONO film 10, and the phosphorous-added polysilicon film 8 as masks to form a diffusion layer 30b in a self-alignment manner. The diffusion layer 30b has such an injection depth that the impurity is distributed along the surface of the silicon substrate 1. In order to form the diffusion layer 30b, As may be injected in the order of $10^{15}$ cm$^{-2}$ by an energy of about 30 to 40 keV.

The buried diffusion layer 30a and the diffusion layer 30b which are formed as described above are connected and integrated with each other to constitute a source line. More specifically, since the lower end of the impurity distribution of the buried diffusion layer 30a is located at a position deeper than the bottom surface of the trench 5, the portions of diffusion layers 30b under the bottom surface of the trench 5 can be almost linearly connected to each other. Since the source line 30 has such a structure, when a current is read out from the source region of a certain memory cell through the diffusion layer 30b of the side surface of the trench, the current can flow in an almost linear path while alternately passing through the diffusion layer 30b and the buried diffusion layer 30a under the bottom surface of the trench.

The buried diffusion layer 30a and the diffusion layer 30b, as shown in FIG. 7N, are vertically connected with each other under the bottom surface of the trench 5. In this manner, the sectional area of the source line 30 under the bottom surface of the trench 5 increases, and the source line resistance further reduces. In particular, in this embodiment, since the buried diffusion layer 30a under the trench 5 is formed at a position deeper than under the source-drain region 18, the effect of increasing the sectional area of the source line 30 under the bottom surface of the trench is more remarkable.

In this embodiment, after the buried diffusion layer 30a is formed, the buried oxide film 6 serving as an element isolation insulating film is removed by etching before the diffusion layer 30b is formed. This brings the following advantage that the injection depth and the shape of the buried diffusion layer 30a can be easily controlled. More specifically, by forming the buried diffusion layer 30a while the trench is buried with the oxide film 6, the buried diffusion layer 30a can be formed in almost parallel to a major surface of the silicon substrate 1 even though the trench 5 is formed on the surface. As described above, when ion injection of the buried diffusion layer 30a is performed after the upper surface of the buried oxide film 6 is etched in a predetermined shape, the shape and the injection depth of the buried diffusion layer 30a can be controlled.

Figure 6O:
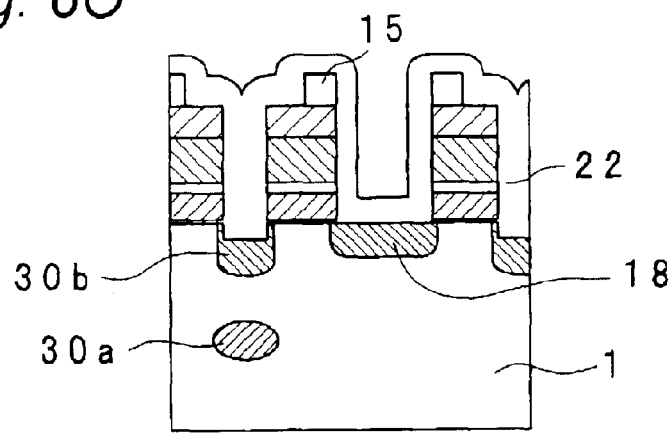

(4) Formation of Drain-contact Hole and Bit Line As shown in FIGS. 6O to 6S, a drain-contact hole and a bit line are formed. As shown in FIG. 6O, after the resist 19 is removed, ion injection is performed to form an N/P diffusion layer in the peripheral circuit region. Thereafter, an oxide film 22 having a thickness of about 2000 Å is deposited. When SAC (Self Aligned Contact) for forming a contact hole in a self-alignment manner with respect to the control electrode is used, instead of forming the oxide film 22, a laminate film constituted by an oxide film having a thickness of about 100 Å and a nitride film having a thickness of about 2000 Å is formed.

Figure 6P:
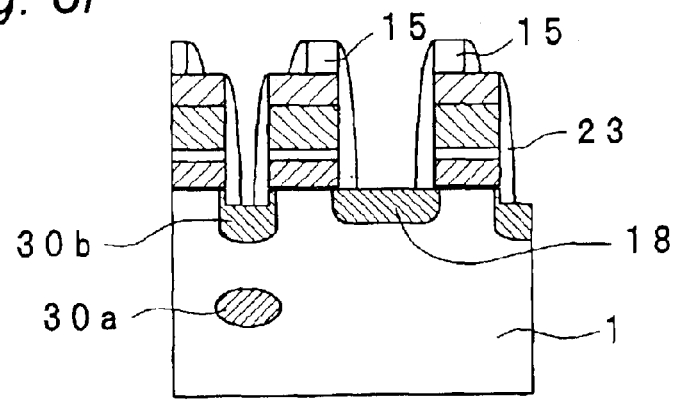
Figure 6Q:
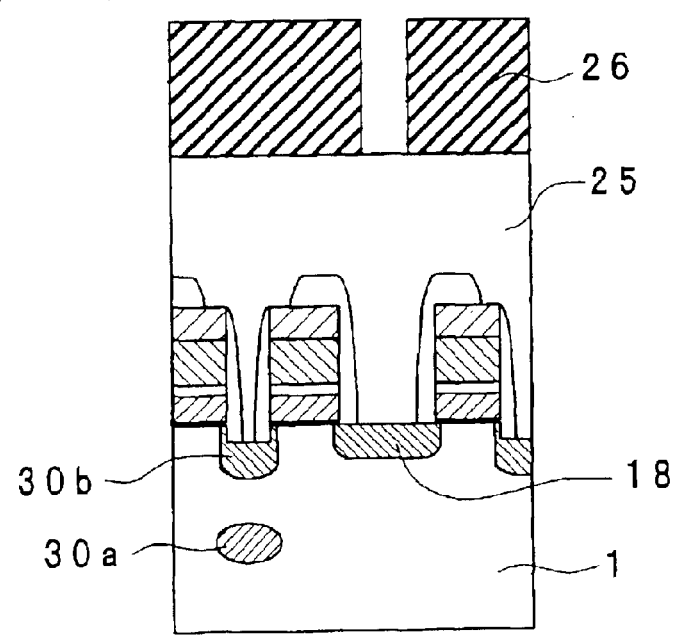

As shown in FIG. 6P, the oxide film 22 is etched back to form side walls 23. Thereafter, ion injection is performed to form an N+/P+ diffusion layer in the peripheral circuit region. As shown in FIG. 6Q, a BPSG 25 having a thickness of about 10000 Å is deposited as an insulating interlayer. After the resultant structure is flattened by CMP or the like, a photoresist 26 is formed and partly removed in a region for forming a contact hole.

Figure 6R:
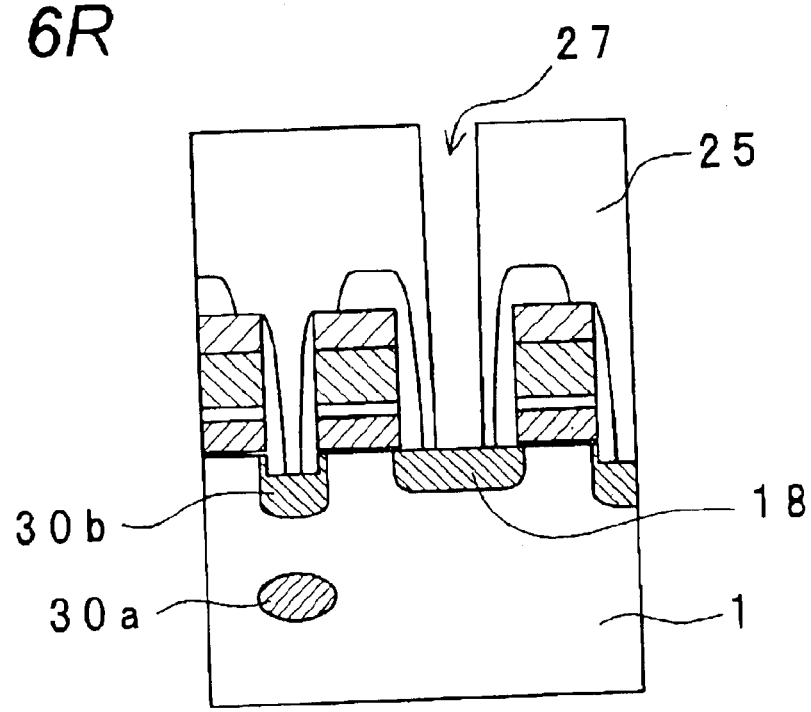
Figure 6S:
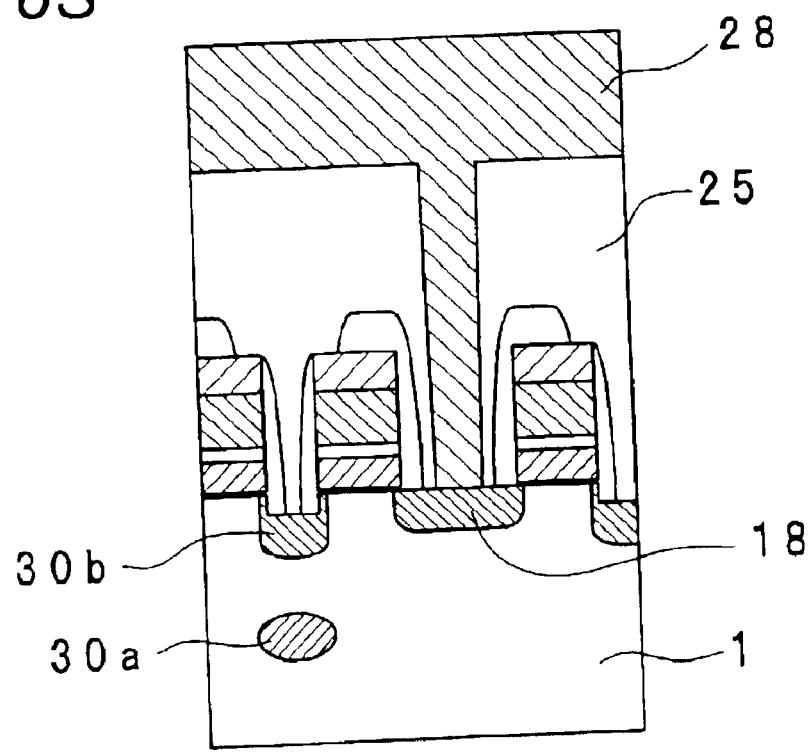

As shown in FIG. 6R, the BPSG film 25 is dry-etched by using the photoresist 26 as a mask to form the contact hole 27. As shown in FIG. 6S, the photoresist 26 is removed, and the contact hole 27 is buried with tungsten (W) to form a plug. Thereafter, a metal film consisting of aluminum or the like and having a thickness of about 4000 A is deposited, and the resultant structure is patterned by photolithography to form a bit line 28.

Embodiment 2

In this embodiment, in the step of forming a diffusion layer 30b, an impurity is injected in the semiconductor substrate 1 from both vertical and diagonal directions with respect to the semiconductor substrate to reduce the resistance of the source line 30 on a side surface of the trench 5. As shown in FIG. 6N, the injection of impurity into the side surface portion of the trench 5 tends to be difficult more than that into the bottom surface portion of the trench 5. In particular, if the side walls of the trench 5 is perpendicular, the tendency is conspicuous. According to the present invention, a read current may pass through the side surface of the trench 5 only once per unit bit, the influence of the side surface of the trench 5 on the source line resistance is relatively small. However, when the impurity concentration on the side surface of the trench 5 is extremely small, the influence cannot be neglected. Therefore, in this embodiment, an impurity is injected in the silicon substrate 1 in an oblique angle to increase the impurity concentration of the side surface portion of the trench 5. In this manner, the increment of the resistance of the source line 30 can be suppressed.

The impurity injection from inclined angle in the silicon substrate 1 may be performed after or before the injection from vertical angle. Alternatively, the diagonal injection and the vertical injection may be simultaneously performed.

The number of times of injection is not limited to a specific number, the vertical injection and the diagonal injection may be performed more than once each.

Embodiment 3

Figure 8:
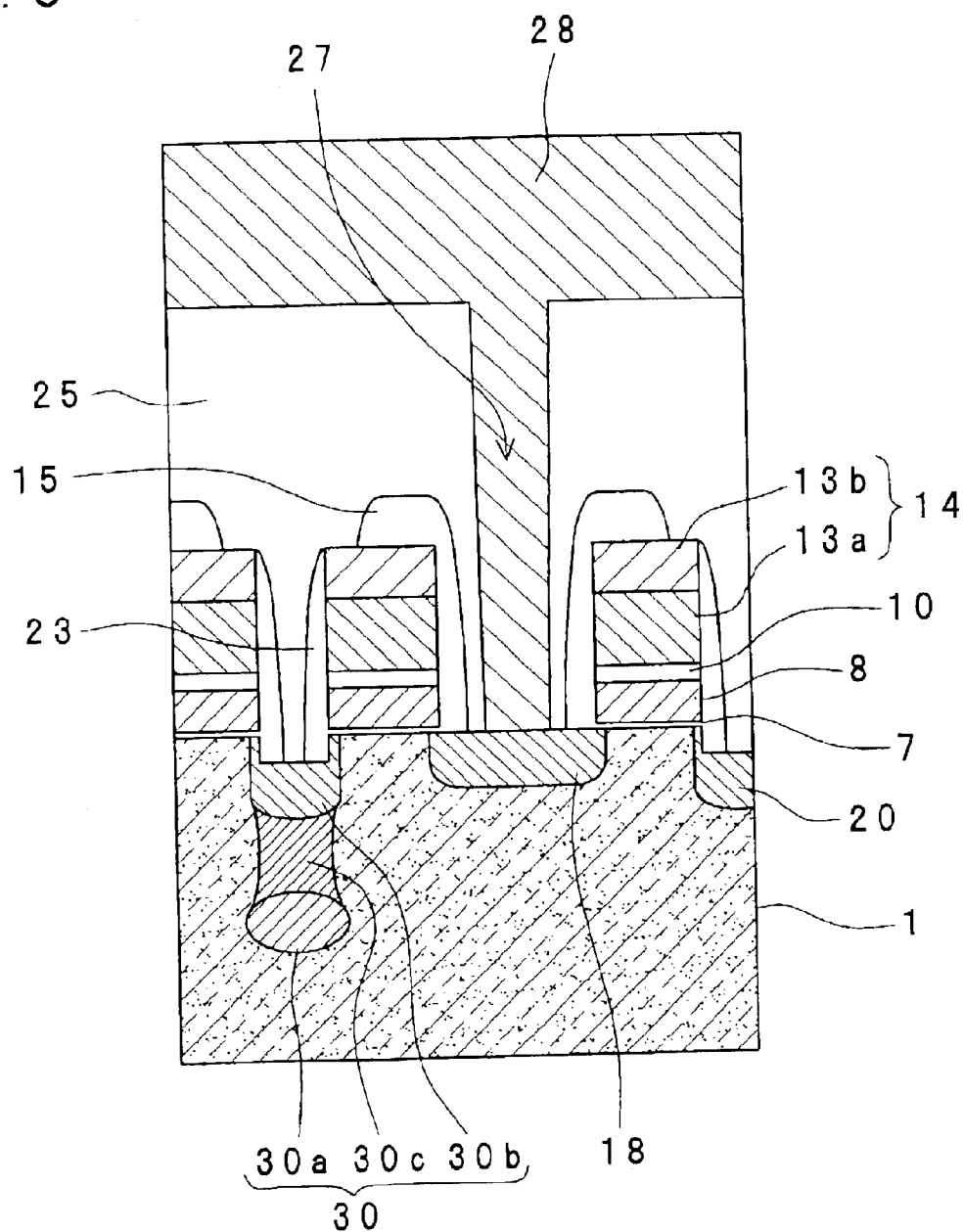
FIG. 8 is a sectional view showing a section corresponding to the A–A' section in FIG. 1 in a nonvolatile semiconductor memory device according to the second embodiment of the present invention.
Figure 9:
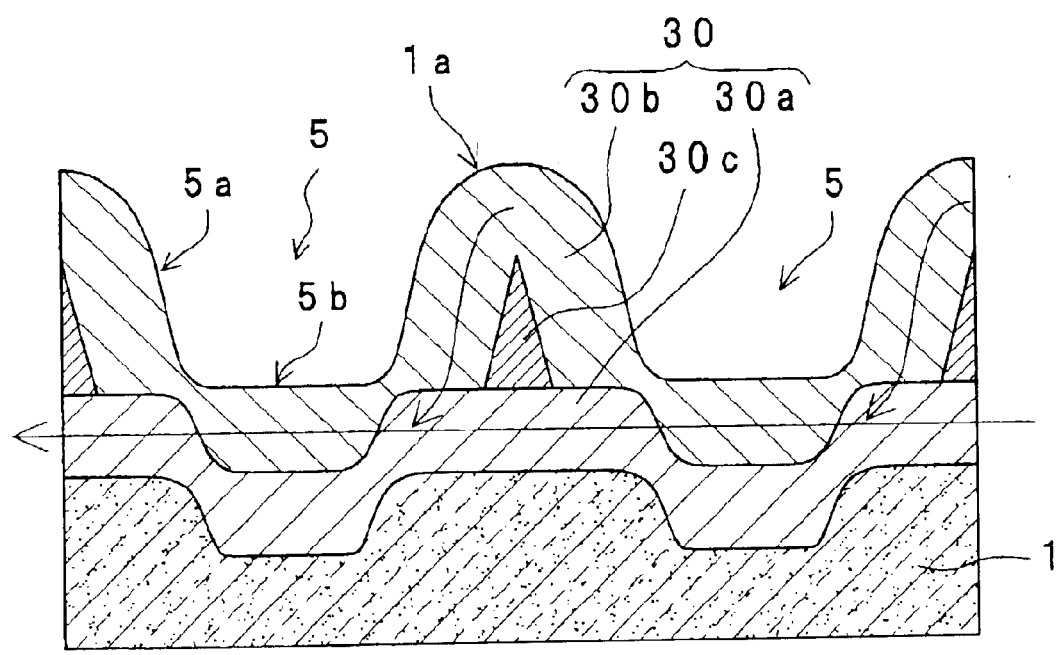
FIG. 9 is a sectional view showing a section corresponding to the C–C' section in FIG. 1 in a nonvolatile semiconductor memory device according to the third embodiment of the present invention.

In this embodiment, a second diffusion layer 30c is formed between the buried diffusion layer 30a and the diffusion layer 30b to further reduce the resistance of the source line. The other points of this embodiment are the same as those in the first embodiment. An example of the nonvolatile semiconductor memory device according to this embodiment is shown in FIGS. 8 and 9. FIG. 8 corresponds to the A–A' section in FIG. 1, and FIG. 9 corresponds to the C–C' section in FIG. 1. Preferably, as shown in FIG. 9, the second diffusion layer 30c is formed between the buried diffusion layer 30a and the diffusion layer 30b so that the impurity is continuously distributed from the buried diffusion layer 30a to the diffusion layer 30b, especially at the projection portion 1a serving as a memory cell. Such arrangement of the second diffusion layer 30c reduces the resistance of the source line.

The second diffusion layer 30c may be formed, for example, in the steps shown in FIGS. 6N and 7N of the first embodiment. The formation of the second diffusion layer 30c may be either before or after the formation of the diffusion layer 30b. For forming the second diffusion layer 30c, As may be injected at an injection energy of 40 to 500 keV so that an injection depth is set at a position between the buried diffusion layer 30a and the diffusion layer 30b.

In the first to third embodiments, the device formed with trench element isolation method has been exemplified. However, the present invention is not limited to using the trench isolation. For example, a selective oxidation method (LOCOS) may be used for isolating elements. In this case, a recessed portion is formed in the silicon substrate from which the field oxide film is removed. Accordingly, even in the memory device with LOCOS method, the resistance of the source line can be reduced by applying the present invention.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be constructed as being included therein.

What is claimed is:

1. A nonvolatile semiconductor memory device comprising:

a semiconductor substrate, a plurality of memory cells arranged in the form of a matrix on said semiconductor substrate, each of said memory cells including transistors having floating gate electrodes and control gate electrodes;

element isolation insulating films for isolating said memory cells; and source lines formed in a self-alignment manner with respect to said control gate electrodes;

wherein the surface of said semiconductor substrate has such a periodical unevenness along said source lines that the portions of said memory cells form projection portions and the portions where said element isolation insulating films have removed form recess portions;

each of said source lines has a diffusion layer in which an impurity is distributed along the surface of said semiconductor substrate and a buried diffusion layer in which an impurity is distributed at a position deeper than said diffusion layer;.

and said buried diffusion layer connects a plurality of portions of said diffusion layers under the bottom surface of said recess portion to each other.

2. The nonvolatile semiconductor memory device according to claim 1, wherein said diffusion layer and said buried diffusion layer is connected each other at said projection portion.

3. The nonvolatile semiconductor memory device according to claim 1, wherein said source line is at a ground level or in an floating state in any of write, erase, and read operations.

4. The nonvolatile semiconductor memory device according to claim 2, wherein said source line is at a ground level or in an floating state in any of write, erase, and read operations.

* * * * *